United States Patent [19]

Egan

[11] 4,388,598
[45] Jun. 14, 1983

[54] LOSS-OF-PHASE-LOCK INDICATOR CIRCUIT

[75] Inventor: William F. Egan, Cupertino, Calif.

[73] Assignee: The United States of America as represented by the Secretary of the Navy, Washington, D.C.

[21] Appl. No.: 203,086

[22] Filed: Nov. 3, 1980

[51] Int. Cl.³ ............................................. H03L 7/12
[52] U.S. Cl. ........................................ 331/4; 331/25; 331/DIG 2
[58] Field of Search ................. 331/1 R, 1 A, 17, 18, 331/25, 4, DIG. 2

[56] References Cited

U.S. PATENT DOCUMENTS

| | | |
|---|---|---|
| 3,080,533 | 3/1963 | Edwards . |
| 3,805,183 | 4/1974 | Lance .................................... 331/18 |
| 3,932,821 | 1/1976 | McClaskey .......................... 331/25 |
| 3,961,282 | 6/1976 | Chen et al. ......................... 331/1 R |
| 4,125,815 | 11/1978 | Kirschner . |
| 4,131,862 | 12/1978 | Black et al. ............................. 331/4 |
| 4,151,463 | 4/1979 | Kibler ............................... 331/25 X |
| 4,316,154 | 2/1982 | Krause .......................... 331/DIG. 2 |

Primary Examiner—Siegfried H. Grimm
Assistant Examiner—Edward P. Westin
Attorney, Agent, or Firm—R. S. Sciascia; Charles D. B. Curry; George L. Craig

[57] ABSTRACT

A loss-of-phase-lock indicator circuit is described which detects an out-of-limit voltage, whether steady or transitory. A pair of comparators, one for the high limit and the other for the low limit, are inserted in series between the tuning voltage and the sweep feedback amplifier, and are dc-coupled to the peak detector in the failure circuit. Additionally, a "dither" voltage is added in series with the phase detector, which ac voltage is large enough to swing the tuning voltage between limits at the loop amplifier output, but small enough to produce little effect on the output during phase lock.

2 Claims, 1 Drawing Figure

U.S. Patent   Jun. 14, 1983   4,388,598
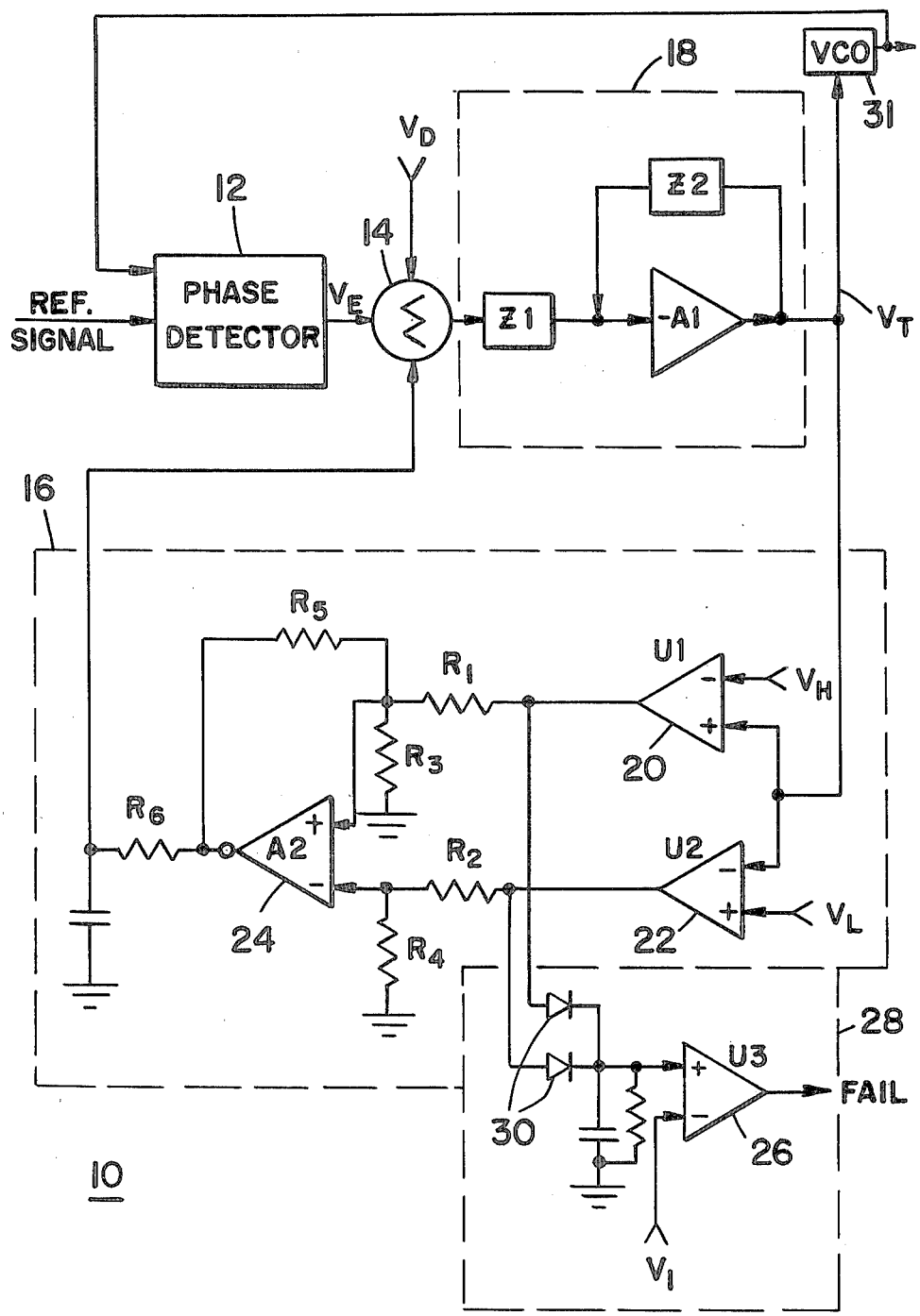

LOSS-OF-PHASE-LOCK INDICATOR CIRCUIT

BACKGROUND OF THE INVENTION

1. Field of the Invention

The present invention relates to a phase-locked oscillator, and more particularly to a circuit for indicating when the tuning voltage of a phase-locked voltage controlled oscillator (VCO) is out of range and causes an "out-of-lock" condition.

2. Description of the Prior Art

A phase-locked oscillator often must be brought close to its correct frequency before phase lock occurs. One method for doing this is to employ an additional feedback loop to cause the tuning voltage to oscillate. When phase lock occurs the feedback of the phase-locked loop overcomes the added loop and stops the oscillation. Sometimes the added loop includes a Schmidt trigger that changes state at the tuning voltage sweep limits. The Schmidt trigger is connected such that the change in state causes the sweep voltage to reverse direction, producing a saw-tooth wave. The Schmidt trigger has the advantage of eliminating the influence of the added loop during steady-stage operation. The sweeping voltage is detected to indicate an out-of-lock-condition.

However, the out-of-lock indicator in such a circuit fails if the tuning voltage does not sweep, even though the circuit is not phase-locked. This occurs if the loop amplifier fails or if the voltage drift in some component, particularly the phase detector, is sufficient to prevent the sweep voltage from reaching a limit. Ordinarily, the Schmidt trigger's square-wave output is converted to approximately a saw-tooth by low passing, but if the sweeping tuning voltage does not reach a limit, the sweep voltage will be an exponential which reaches steady-state before attaining the limit. Because of high gain in the loop amplifier, slightly more drift in the same direction causes the tuning voltage to go beyond the other sweep limit. This problem cannot be solved by arbitrarily increasing the amplitude of the sweeping voltage because an excessively large sweep voltage can overcome the feedback of the phase-locked loop and prevent locking.

SUMMARY OF THE INVENTION

Accordingly, the present invention provides a loss-of-phase-lock indicator circuit which detects an out-of-limit voltage, whether steady or transitory, during sweep. A pair of comparators, one for the high limit and the other for the low limit, are inserted in series between the tuning voltage and the sweep feedback amplifier, and are dc-coupled to the peak detector in the failure circuit. Additionally a "dither" voltage is added in series with the phase detector, which ac voltage is large enough to swing the tuning voltage between limits at the loop amplifier output, but small enough to produce little effect on the output during phase lock.

Therefore, it is an object of the present invention to indicate an out-of-lock condition in a phase-locked oscillator under common failure conditions.

Other objects, advantages and novel features of the present invention will be apparent from the following detailed description when read in conjunction with the appended claims and the attached drawing.

BRIEF DESCRIPTION OF THE DRAWING

The FIGURE is a schematic diagram of the improved phase-lock-loss indicator circuit according to the present invention.

DESCRIPTION OF THE PREFERRED EMBODIMENT

Referring to the FIGURE a phase-lock loop circuit between the output of a phase detector 12 and the control terminal of a voltage controlled oscillator (VCO) 31 is illustrated. The error signal, $V_E$, from the phase detector 12 is input to a summing circuit 14. Also input to the summing circuit 14 is an ac dither voltage, $V_D$, and the output of a sweep feedback circuit 16. The output of the summing circuit 14 is input to a control circuit 18, the output of which is the VCO tuning voltage, $V_T$.

$V_T$ is also input to two comparators, 20 and 22, and is compared with the high and low limit voltages, $V_H$ and $V_L$ respectively. The outputs of the comparators 20, 22 are input to an operational amplifier 24, the output of which is input into the summing circuit 14. The outputs of the comparators 20, 22 are also input into a third comparator 26 to provide a failure indication when $V_T$ is out of limits.

In operation, during lock the loop through the phase detector 12, the control circuit 18 and the VCO causes $V_E$ to cancel $V_D$. $V_D$ must be large enough to sweep $V_T$ from $V_H$ to $V_L$, the hold-in range. If $V_H - V_L = \Delta V$, then the peak-to-peak swing of $V_D$ must conform to $V_{Dp\text{-}p} > \Delta V / A1$. For example in the figure if the gain of operational amplifier A1 is 110 dB and $\Delta V$ is 15 volts, then $V_{Dp\text{-}p}$ must exceed 50 $\mu$volts. If the phase detector 12 sensitivity is 0.1 V/radian, 50 $\mu$V corresponds to 1/2000 radian phase sweep p-p, and if $V_D$ is a sinusoid at 1 Hz, then a loop which is wide compared to 1 Hz would produce a peak frequency change of only 1/4000 Hz from the VCO.

When the loop is not locked the sweep feedback circuit 16 through amplifier 24 causes sweeping to give acquisition of lock as in prior art circuits. Each time $V_H$ or $V_L$ is reached, the sweep turns around so that $V_T$ goes between $V_H$ and $V_L$. Turn around occurs because the comparators 20, 22 sense the limits $V_H$ and $V_L$. The failure indicator 28 operates when either comparator 20, 22 triggers.

If excessive phase detector offset voltage causes $V_T$ to stop before reaching $V_H$ or $V_L$, $V_D$ will force one of these limits to be reached and one of the comparators, 20 or 22 will still be triggered. Thus, the failure signal FAIL is generated in the situation where $V_T$ might stay between $V_H$ and $V_L$ without $V_D$. If the offset is even worse, $V_T$ may stay above $V_H$ or below $V_L$, but failure will still be indicated.

Thus, the addition of comparators 20, 22 and the DC coupling of their output to the peak detector 30 in the failure indication circuit 28 causes a steady rail condition ($V_T < V_L$ or $V_T > V_H$) to be indicated as well as a sweeping condition for the out-of-lock state. The addition of $V_D$ insures that even the condition where the sweep extreme of $V_T$ would stop short of a limit ($V_H$ or $V_L$), and thus the sweep would not reverse direction, is detected. The addition of the comparators 20, 22 in series with amplifier 24, rather than in parallel, allows the same limits, $V_H$ and $V_L$ to be used for the sweep and the failure indication. Otherwise the failure indication limits would wander relative to the sweep limits, possibly causing false or no indication, and a region of safety would have to exist where failure would be indicated but lock would occur. (If the possibility of failure of comparators 20,22 is of concern in a particular application, a second pair of such comparators, having closer limits and driving only the peak detector through additional diodes such as 30, can still be added in parallel.)

What is claimed is:

1. A loss-of-phase-lock indicator circuit comprising:
   (a) a phase detector receiving as inputs a reference signal and an output signal from a voltage controlled oscillator (VCO), said phase detector producing as output an error signal when said signal from said VCO and said reference signal vary a predetermined amount;
   (b) a summing circuit receiving as inputs a predetermined dither voltage signal, a sweep-feedback signal and said error signal from said phase detector and having an output signal;
   (c) a feedback circuit receiving said output signal from said summing circuit and having as output a tuning voltage signal, said tuning voltage signal being received as a control input by said VCO;
   (d) a first comparator receiving as inputs said tuning voltage signal and a voltage corresponding to an upper limit value for said tuning voltage and having an output;
   (e) a second comparator receiving as inputs said tuning voltage signal and a voltage corresponding to a lower limit value for said tuning voltage signal and having an output;
   (f) an operational amplifier serially connected to and receiving said outputs of said first and said second comparator and having as output said sweep feedback signal received by said summing circuit such that said tuning voltage signal sweeps between said upper and said lower limit values when said VCO is out-of-lock; and
   (g) means for generating a failure signal for all out-of-lock conditions operably connected to said first and said second comparators.

2. A loss-of-phase-lock indicator circuit comprising:
   (a) a phase detector receiving as inputs a reference signal and an output signal from a voltage controlled oscillator (VCO), said phase detector producing as output an error signal when said signal from said VCO and said reference signal vary a predetermined amount;
   (b) a summing circuit receiving as inputs a predetermined dither voltage signal, a sweep-feedback signal and said error signal from said phase detector and having an output signal;
   (c) a feedback circuit receiving said output signal from said summing circuit and having as output a tuning voltage signal, said tuning voltage signal being received as a control input by said VCO;
   (d) a first comparator receiving as inputs said tuning voltage signal and a voltage corresponding to an upper limit value for said tuning voltage signal and having an output;
   (e) a second comparator receiving as inputs said tuning voltage signal and a voltage corresponding to a lower limit value for said tuning voltage signal and having an output;
   (f) an operational amplifier serially connected to and receiving said outputs of said first and said second comparator and having as output a sweep feedback signal received by said summing circuit such that said tuning voltage signal sweeps between said upper and said lower limit values when said VCO is out-of-lock;
   (g) a first peak detector having an output and receiving as input said output of said first comparator;
   (h) a second peak detector having an output and receiving as input said output of said second comparator; and
   (i) a third comparator receiving as inputs said outputs of said first and said second peak detectors and a predetermined input signal and having as output a failure signal whenever said VCO is out-of-lock.

* * * * *